United States Patent [19]

Petrosino

[11] Patent Number: 5,751,641
[45] Date of Patent: May 12, 1998

[54] MICROPROCESSOR MEMORY TEST CIRCUIT AND METHOD

[75] Inventor: Gianluca Petrosino, Phoenix, Ariz.

[73] Assignee: SGS-Thomson Microelectronics, Inc., Carrollton, Tex.

[21] Appl. No.: 579,008

[22] Filed: Dec. 27, 1995

[51] Int. Cl.$^6$ ........................ G11C 7/00
[52] U.S. Cl. ............ 365/189.05; 365/201; 395/183.06
[58] Field of Search .................... 365/189.05, 201; 371/40.1; 395/280, 183.06

[56] References Cited

U.S. PATENT DOCUMENTS

| | | | |
|---|---|---|---|
| 4,688,191 | 8/1987 | Conners | 395/280 |
| 5,435,001 | 7/1995 | Rahman et al. | 395/183.06 |

OTHER PUBLICATIONS

Barry B. Brey, *The Intel 32-Bit Microprocessors: 80386, 80486, and Pentium*, 1995, pp. 363-378.

Betty Prince, *Semiconductor Memories: A Handbook of Design, Manufacture, and Application*, 2d ed., 1991, pp. 697-716.

*Micromate User's Guide*, Micron Technology, 1995, pp. 3-1 to 3-25.

A.J. Van de Goor, *Testing Semiconductor Memories: Theory and Practice*, 1991, pp. 65-88, 237-257, 259-267, 269-284, 425-436, 473-476, 489-501.

Rodnay Zaks and Alexander Wolfe, *From Chips to Systems: An Introduction to Microcomputers*, 2$^{nd}$ Edition. Sybex, Inc., 1981. pp. 116-159.

*ST486DX/DX2 Databook*, 1$^{st}$ Edition. Jul. 1994. pp. 4, 13-16,19, 51-53, 87-90.

*Primary Examiner*—David C. Nelms
*Assistant Examiner*—Trong Quang Phan
*Attorney, Agent, or Firm*—David V. Carlson; Theodore E. Galanthay; Lisa K. Jorgenson

[57] ABSTRACT

A circuit and method for testing on-chip memory for a microprocessor or a microcomputer is disclosed. The memory test circuit includes an input register, an output register, an adder, and a sequencer to control the test process. The process includes receiving a simple communication protocol from the control unit to start the test, running a common memory test such as a checker board, AAAAh, 5555h and the like, and then storing the test results in an output register. The test circuit can include a bi-directional RESET signal means for disabling the system while the microprocessor or microcomputer runs its memory test.

10 Claims, 3 Drawing Sheets

MICROPROCESSOR MEMORY TEST CIRCUIT AND METHOD

BACKGROUND OF THE INVENTION

1. Field of the invention

This invention relates to electronic circuits used in microprocessors and microcontrollers and more specifically to circuits used to test the on-chip memory in microprocessors and microcontrollers.

2. Description of the Relevant Art

The problem addressed by this invention is encountered in circuits and methods used to test on-chip memory in microprocessors and microcontrollers. Currently, all on-chip memory must be tested in the production factory to assure their functionality and reliability. The testing of memory is necessarily long since each memory cell must be written to, read, compared, and erased many times to check their functionality. As the on-chip memory is increased, the time necessary to test the memory is also increased.

A trend in the development of microprocessors has been to increase the size of on-chip memory. For example, the on-chip cache memory has increased from 8 KByte on the first implementation of the 486 class of microprocessor to 256 Kbytes for the 686 class of microprocessor. The use of on-chip non-volatile memory is also increasing, albeit, not as quickly.

As the size of on-chip memory increases, the chance of rejecting the microprocessor increases since the chances of a having a bad memory cell increases. Unfortunately, the processes used to implement microprocessors can not provide non-volatile memory cells for storing the addresses of failed memory cells. It is not possible to implement redundancy on the volatile on-chip memory, such as cache memory, on current microprocessors. Therefore, if just one cell does not work, the chip must be discarded. Furthermore, the cost of micros has also increased and therefore the cost of a memory failure which requires that the micro being discarded has also increased.

Referring to FIG. 1, the functional signal groupings of a 486 generation microprocessor 10 is shown as is known in the prior art. This FIG. 1 shows the input and output signals including the address bus, data bus, bus cycle control signals, and the RESET input signal and the WM_RST signal.

As shown in FIG. 1, and is known in the art, the microprocessor 10 receives and/or transmits a 1X clock signal at a CLK terminal, a Float Control signal at a UP# terminal, reset signals RESET and WM_RST at RESET and WM_RST terminals, respectively, and Address Bus signals at A31-A4, A3-A2 and BE3#-BE0# terminals. The 486 microprocessor 10 receives and transmits data on databus terminals D0-D31, receives and transmits parity data on terminals DP0-DP3, and provides a parity check output on terminal PCHK# which indicates a parity error was detected during a read operation. A plurality of signals from the microprocessor 10 define the current bus cycle being executed and include the read/write signal on terminal W/R# and a memory or I/O signal on a terminal M/IO# which indicates whether the current bus cycle is a read or write and whether the address bus contains a memory address or an I/O port number, respectively. Additional bus cycle control signals are received on terminals ADS#, SMADS#, BLAST#, RDY#, BRDY#, BS8#, and BS16# which transmit and receive respective control signals as known in the art, and described, for example, in the SGS-Thomson ST486DX/DX2 data book.

As also shown in FIG. 1, the microprocessor 10 further includes interrupt control signals received on terminals INTR, NMI, and SMI# which receive and transmit various interrupt control signals. Control of cache memory is performed by the microprocessor 10 using a plurality of cache control signals received and transmitted on terminals KEN#, FLUSH#, RPLSET(1-0), RPLVAL#, PCD, and PWT. The microprocessor 10 transmits and receives signals on terminals AHOLD, EADS#, HITM#, and INVAL to perform various functions such as a cache invalidation cycle. An address mask signal may be received by the microprocessor 10 on a terminal A20M# to cause the microprocessor to operate as if it had a 1M byte real memory system as in the 8086 microprocessor. When a co-processor is used with the microprocessor 10, interface signals on terminals FERR# and IGNNE# are transmitted and received by the microprocessor to handle the processing of floating-point data. A plurality of bus arbitration signals received on terminals BREQ, HOLD, HLDA, and BOFF# are transmitted and received by the microprocessor 10 to control access to the address, data and control buses to which the microprocessor and other system components are connected. The microprocessor 10 also includes terminals SUSP# and SUSPA# which receive and transmit power management signals as known in the art, and described, for example, in the SGS-Thomson ST486DX/DX2 data book.

In the prior art, the RESET signal is an active high input signal that, when asserted, suspends all operations in progress and places the 486 into a reset state. RESET is an asynchronous signal but must meet specified setup and hold times to guarantee recognition at a particular clock edge. While RESET is active, only the hold input signal is recognized. The 486 output signals are initialized to their reset state during the internal processor reset sequence. FIG. 4 shows the typical interface for the reset signal as an inverter. It is worth noting that the reset pin only receives the reset signal in the prior art.

The WM_RST (warm reset) signal is an active high input signal that, when asserted, suspends all operations in progress and places the 486 in a known state. WM_RST is an asynchronous signal but must also meet specified setup and hold times to guarantee recognition at a particular clock edge. Configuration Registers remain unchanged. If RESET and WM_RST are asserted simultaneously, WM_RST is ignored and RESET takes priority.

FIG. 2 illustrates the block diagram of a 486 class microprocessor as is known in the prior art. With this type of architecture, on-chip memory is tested by the CPU accessing a test program from external source and then executing the test program. This requires the CPU to be dedicated to the task of testing the on-chip memory. For the newest generations of micros, this test time is extending into a minute or more of test time dedicated to testing the on-chip memory.

Therefore, it is an object of the invention to decrease the test time on on-chip memory.

It is another object of the invention to provide on-chip memory test capability.

It is yet another object of the invention to provide microprocessors with bi-direction reset capability.

These and other objects, features, and advantages of the invention will be apparent to those skilled in the art from the following detailed description of the invention, when read with the drawings and appended claims.

SUMMARY OF THE INVENTION

The disclosed invention can be summarized as a circuit and method for testing on-chip memory for a microprocessor or a microcomputer. The memory test circuit includes an input register, an output register, an adder, and a sequencer to control the test process. The process includes receiving a simple communication protocol from the control unit to start the test, running a common memory test such as a checker board, AAAAh, 5555h and the like, and then storing the test results in an output register. The test circuit can include a bi-directional RESET signal means for disabling the system while the microprocessor or microcomputer runs its memory test.

DETAILED DESCRIPTION OF THE PREFERRED EMBODIMENT

Figure 3:
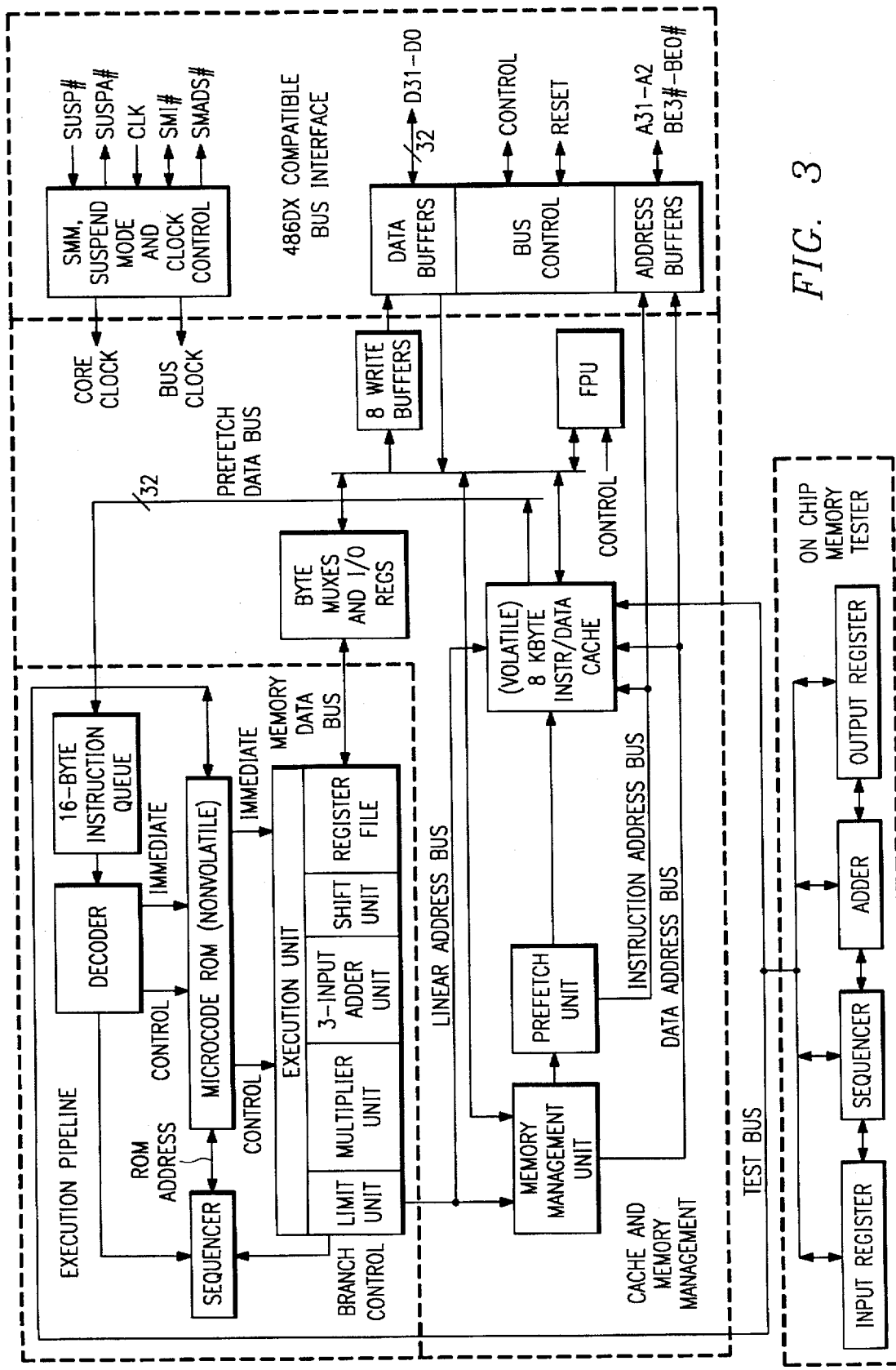
FIG. 3 is a block diagram of a CPU with an on-chip memory tester as is disclosed in an embodiment of the invention.

A microprocessor with an on-chip memory tester constructed according to an embodiment of the invention will now be described. Referring now to FIG. 3, the block diagram of an ST486 plus a on-chip memory tester is disclosed. The ST486 shows the 486 bus interface which includes the data buffers, bus control, and address buffers. The data buffers provide data to (and from) I/O registers, instr/data cache, and the FPU, as is known in the prior art. Similarly, the address buffers provide the address to (and from) the memory management unit and the instr/data cache. The instr/data cache provides instructions to the 16 byte instruction queue which are decoded by the decoder and fed to the sequencer and to the microcode ROM. The instructions are then executed in the execution pipeline as is known in the prior art.

In this embodiment of the invention, an on-chip memory tester is added to the prior art CPU. The on-chip memory tester includes an input register, a sequencer, an adder, and an output register, all coupled together on a test bus. The test bus is also coupled directly to the on-chip memory which, in this case, is the 8 KBytes of cache and the microcode ROM. A very simple communication protocol from the micro can be defined to start the operation of the memory test. Then, the sequencer can control the adder, input register, and output register to implement the basic kinds of tests for memories such as diagonal reading/writing, checkerboards, AAAAh or 5555h writings along with their associated verifies as is known in the prior art. The results of the test can be stored on the output register so that the CPU and then an automated test equipment (ATE) can read the test results.

By having the dedicated hardware to perform the on-chip memory test, the micro is available to start its self. Therefore, the production test time can be dramatically decreased.

Because the process implementing fast micros can not provide non-volatile memory cells for the storage of the failing addresses (since it would impact the performance of the process) it is not possible to implement redundancy techniques on the volatile on-chip memory such as the cache memory. As the size of on-chip cache memory increases, the yield of micros has decreased due to memory failures. This is because cache memory is now occupying a higher percentage of area on a chip and thus the odds of just one of the cache memory cells not working has increased. The micro is discarded if even just one cell fails.

Using the on-chip memory tester disclosed above, it is possible to test the on-chip memory and store the failed cell locations in volatile memory. By designing in additional memory cells, the failed cell can be replaced with the additional volatile memory. The method would require the steps of:

1. testing the memory at power-up;
2. storing the location of failed memory cells in extra memory;
3. using redundant volatile memory to replace the failed cells;
4. repeating the process on every power-up. By using this method, the production yield high performance micros can be improved by allowing micros which have a few failed memory cells to be mapped and replaced by redundant memory cells at every power-up.

Figure 1:
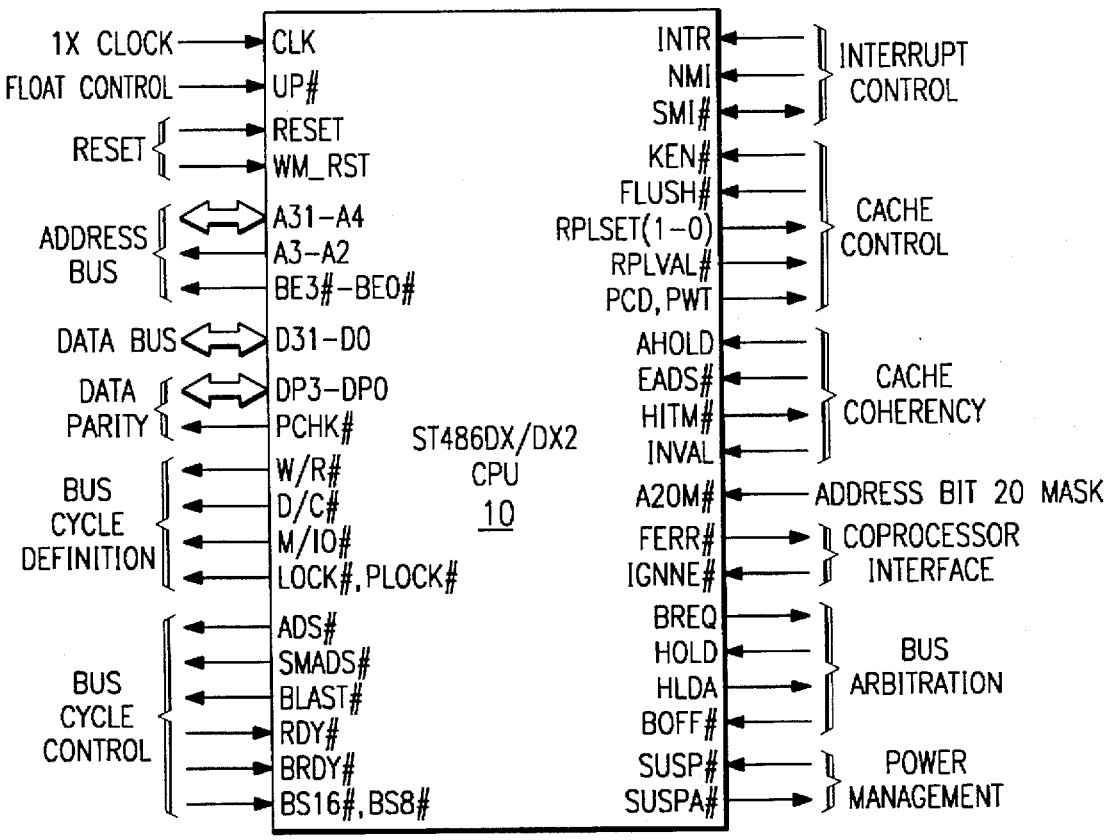
FIG. 1 is a drawing showing the input and output signals of a ST486 CPU as is known in the prior art.
Figure 4:
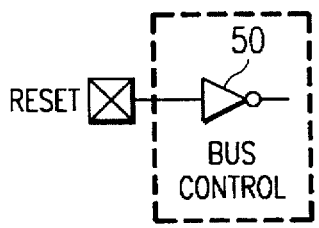
FIG. 4 is a schematic drawing of a reset signal receiver, as is known in the prior art.
Figure 5:
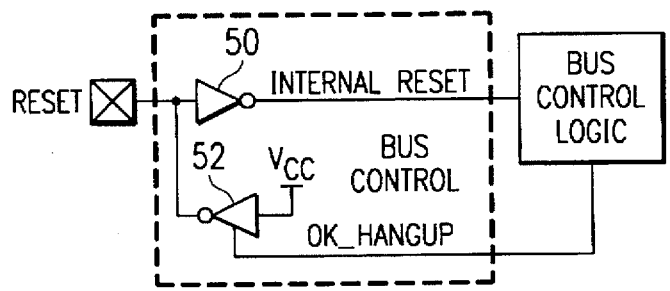
FIG. 5 is a schematic drawing of a reset signal transceiver as is disclosed in an embodiment of the invention.
Figure 2:
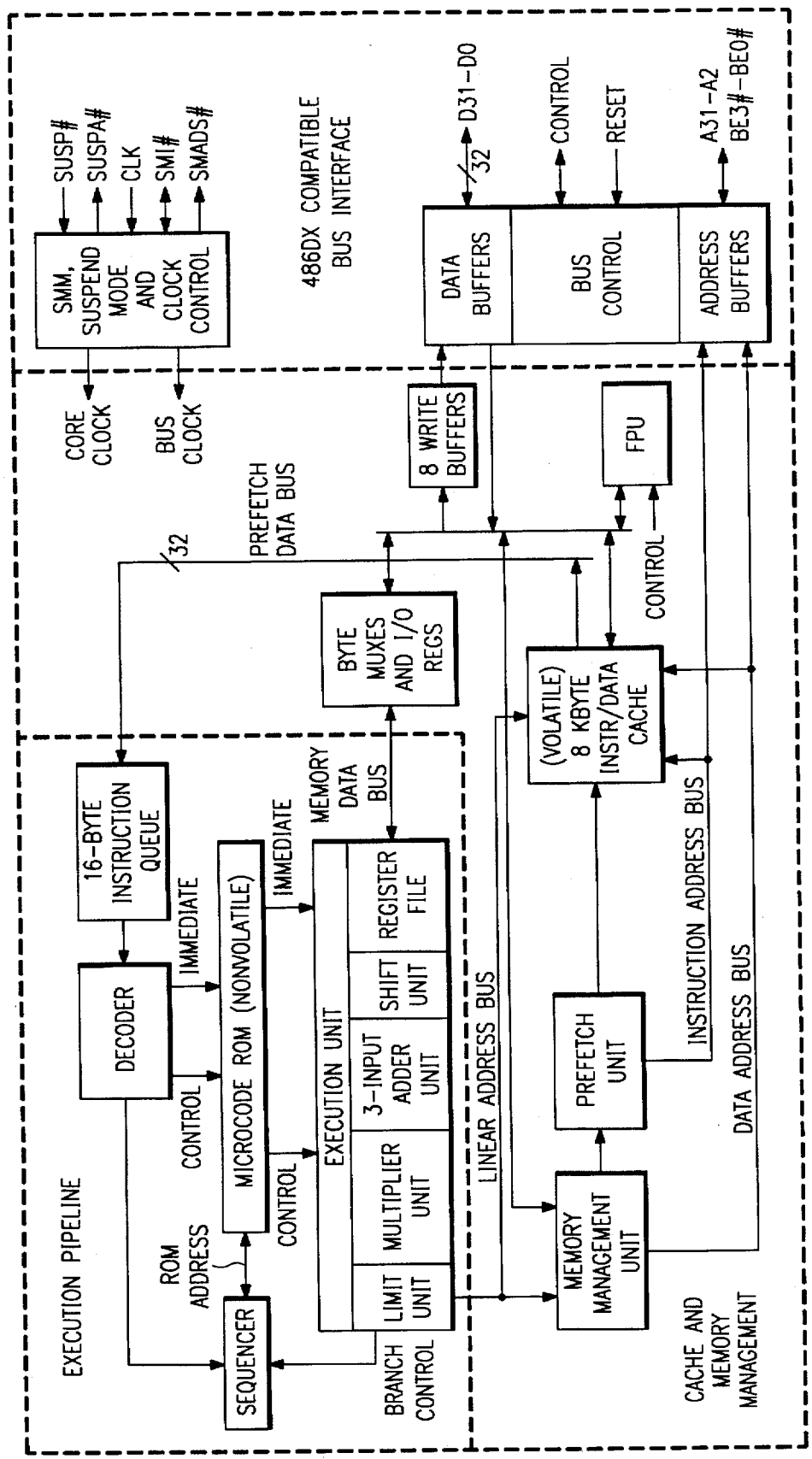
FIG. 2 is a block diagram of an ST486 CPU as is known in the prior art.

To perform the memory test at every power-up, the micro must be able to disable the system until the micro has completed its internal memory testing. It is known in the art that all micros are initialized by an external RESET signal controlled by discrete logic on the system board. FIG. 4 illustrates the prior art RESET signal as being limited to an input only signal. For purposes of performing the aforementioned on-chip memory tests, it is desirable for the micro to be able to hold the RESET signal low until the on-chip memory test is complete. Therefore, FIG. 5 shows a bi-directional RESET signal which has an inverter 50 for receiving a RESET signal on a reset terminal and provides an INTERNAL RESET signal on an output to a bus control logic circuit a tri-state buffer 52 has an enable terminal for receiving an OK hangup signal from the bus control logic circuit and an output terminal coupled to the reset terminal. Tri-state buffer 52 must be robust enough to hold the RESET line against the system source of the RESET signal. Thus, the micro disabled the system after it has completed the on-board memory test. The bus control logic circuit maintains the OK hangup signal provided to the tri-state buffer 52 at an inactive level so long as the on-board memory test is being performed. When the OK hangup signal is inactive, the tri-state buffer 52 drives the signal on the reset terminal at an active level to thereby provide an active RESET signal. Once the on-board memory test is complete, the bus control logic circuit drives the OK hangup signal active to cause the tri-state buffer 52 to assume a high impedance state and stop driving the signal on the reset terminal.

By having this bi-directional RESET circuit, it is possible for the micro to disable the system until it has completed its internal diagnostics.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A microprocessor formed on a semiconductor substrate, comprising:

a reset terminal formed on the semiconductor substrate for receiving an external reset signal which, when active causes the microprocessor to be reset;

a bi-directional reset circuit formed on the semiconductor substrate having an input terminal coupled to the reset terminal, an output terminal, and an enable terminal adapted to receive an enable signal, the bi-directional reset circuit operable to couple the input terminal to the output terminal and, when the enable signal is active, to drive the external reset signal active, wherein the bi-directional reset circuit includes a control unit formed on the semiconductor substrate and coupled to the output terminal and the enable terminal, the control unit operable to drive the enable signal active in response to the external reset signal going active and operable to hold the enable signal active until the the microprocessor has been reset.

2. The microprocessor of claim 1 wherein said bi-directional reset circuit comprises:

a first inverter having an input coupled to said terminal and having an output coupled to said control unit; and a tri-state buffer having an input coupled to said control unit and having an output coupled to said terminal.

3. A microcontroller formed on a semiconductor substrate, comprising:

a reset terminal formed on the semiconductor substrate for receiving an external reset signal which, when active, causes circuitry on the semiconductor substrate to reset the microprocessor;

a bi-directional reset circuit formed on the semiconductor substrate having an input terminal coupled to the reset terminal, an output terminal, and an enable terminal adapted to receive an enable signal, the bi-directional reset circuit operable to couple the input terminal to the output terminal and, when the enable signal is active, to drive the external reset signal active; and a control unit formed on the semiconductor substrate and coupled to the output terminal and the enable terminal, the control unit operable to drive the enable signal active in response to the external reset signal going active and operable to hold the enable signal active until the circuitry on the microprocessor completes resetting the microprocessor to thereby maintain the external reset signal active until the microprocessor is reset.

4. The microcontroller of claim 3 wherein said bi-directional reset circuit comprises:

a first inverter having an input coupled to said terminal and having an output coupled to said control unit; and a tri-state buffer having an input coupled to said control unit and having an output coupled to said terminal.

5. A method for testing memory coupled to a microprocessor, comprising the steps of:

powering-on the microprocessor;

sensing a reset pin of the microprocessor for a reset signal provided by a circuit external to the microprocessor, the reset signal, when active, causing the microprocessor to be reset; and holding the signal on the reset pin active internal to the microprocessor until a memory test has been completed.

6. The method of claim 5 wherein the step of holding the reset line active is performed using a bi-directional RESET circuit.

7. The microprocessor of claim 2 wherein the control unit provides a hangup signal to the tri-state buffer to release said terminal after the microprocessor completes self-testing.

8. A bi-directional reset circuit formed on a semiconductor substrate, comprising:

a reset terminal for receiving a reset signal;

an inverter having an input terminal coupled to the reset terminal which inverts the reset signal and provides the inverted reset signal on an output terminal;

a tri-state buffer circuit having an input terminal coupled to receive a supply voltage signal, an output terminal coupled to the reset terminal, and an enable terminal for receiving an enable signal, the tri-state buffer circuit operable to couple the input terminal to the output terminal in response to the enable signal being active; and a bus control circuit coupled to the output terminal of the inverter and to the enable terminal of the tri-state buffer circuit, the bus control circuit operable to drive the enable signal active in response to the reset signal being active and to drive the enable signal inactive once reset circuitry has completed resetting a microprocessor, wherein the reset terminal, inverter, tri-state buffer circuit, bus control circuit, reset circuitry and microprocessor are all formed on the semiconductor substrate.

9. A method for testing an on-chip memory of a microprocessor, comprising the steps of:

receiving a reset signal on a reset terminal of the microprocessor, the reset signal, when active, causing at least the testing of the on-chip memory;

testing the on-chip memory of the microprocessor automatically in response to receiving the reset signal to detect any defective memory cells of the on-chip memory, wherein the on-chip memory and the microprocessor are formed on a semiconductor substrate;

storing the location of any detected defective memory cells;

substituting for each detected defective memory cell one of a plurality of redundant memory cells; and holding the reset signal at an active level until the on-chip memory has been tested.

10. The method of claim 9 wherein the step of holding the reset terminal at an active level comprises the steps of:

providing the complement of the reset signal;

coupling an output of a tri-state buffer to the reset terminal;

controlling the tri-state buffer in response to the complement of the reset signal so that the tri-state buffer drives the reset pin at the active level; and disabling the tri-state buffer to stop driving the reset terminal at the active level once the on-chip memory tester has completed testing the on-chip memory.

* * * * *